United States Patent
Suzuki et al.

(10) Patent No.: US 10,343,238 B2
(45) Date of Patent: *Jul. 9, 2019

(54) LEAD-FREE SOLDER ALLOY (71) Applicant: SENJU METAL INDUSTRY CO., LTD., Tokyo (JP)

(72) Inventors: Masayuki Suzuki, Tokyo (JP); Naoko Izumita, Tokyo (JP); Shunsaku Yoshikawa, Tokyo (JP); Ken Tachibana, Tokyo (JP); Rei Fujimaki, Tokyo (JP); Hikaru Nomura, Tokyo (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/613,895

(22) Filed: Jun. 5, 2017

(65) Prior Publication Data

US 2018/0001426 A1 Jan. 4, 2018

Related U.S. Application Data (62) Division of application No. 14/653,502, filed as application No. PCT/JP2012/082788 on Dec. 18, 2012.

(51) Int. Cl.
*B23K 35/02* (2006.01)
*C22C 13/00* (2006.01)
(Continued)

(52) U.S. Cl.
CPC ........ *B23K 35/025* (2013.01); *B23K 35/0222* (2013.01); *B23K 35/0244* (2013.01); *B23K 35/26* (2013.01); *B23K 35/262* (2013.01); *B23K 35/36* (2013.01); *C22C 13/00* (2013.01); *C22C 13/02* (2013.01); *H05K 3/3463* (2013.01); *H05K 2201/10636* (2013.01); *Y02P 70/611* (2015.11); *Y10T 403/479* (2015.01)

(58) Field of Classification Search
None
See application file for complete search history.

(56) References Cited

U.S. PATENT DOCUMENTS

| 5,733,501 A | 3/1998 | Takao |
| 6,241,942 B1 | 6/2001 | Murata |

(Continued)

FOREIGN PATENT DOCUMENTS

| CN | 1392817 | 1/2003 |
| CN | 101351297 | 1/2009 |

(Continued)

OTHER PUBLICATIONS

Machine translation of JP2004-188453A, Jul. 2004.*
(Continued)

*Primary Examiner* — Xiaowei Su
(74) *Attorney, Agent, or Firm* — Young & Thompson (57) ABSTRACT

Provided is a lead-free solder alloy that has excellent tensile strength and ductility, does not deform after heat cycles, and does not crack. The In and Bi content are optimized and the Sb and Ni content are adjusted. As a result, this solder alloy has an alloy composition including, by mass, 1.0 to 7.0% of In, 1.5 to 5.5% of Bi, 1.0 to 4.0% of Ag, 0.01 to 0.2% of Ni, and 0.01 to 0.15% of Sb, with the remainder made up by Sn.

12 Claims, 7 Drawing Sheets

(51) Int. Cl.
  *C22C 13/02*   (2006.01)
  *B23K 35/26*   (2006.01)
  *H05K 3/34*    (2006.01)
  *B23K 35/36*   (2006.01)

(56) References Cited

U.S. PATENT DOCUMENTS

| | | |
|---|---|---|
| 6,488,888 B2 | 12/2002 | Murata |
| 8,845,826 B2 | 9/2014 | Kawamata |
| 8,888,932 B2 | 11/2014 | Kawamata |
| 2003/0015575 A1 | 1/2003 | Yamaguchi et al. |
| 2007/0071634 A1 | 3/2007 | Huang et al. |
| 2010/0307823 A1 | 12/2010 | Kawamata |
| 2014/0112710 A1 | 4/2014 | Albrecht |
| 2015/0328722 A1* | 11/2015 | Suzuki .................. B23K 35/26 403/272 |

FOREIGN PATENT DOCUMENTS

| | | |
|---|---|---|
| JP | 2004-188453 | 7/2004 |
| WO | WO 2000/018536 | 4/2000 |

OTHER PUBLICATIONS

Machine translation of WO00/018536, Apr. 2000.*
International Search Report, PCT/JP2012/082788, dated Mar. 26, 2013.
TW Office Action dated Feb. 25, 2015, with partial translation; Application No. 102146647.
Chinese Official Action—201280077824.8—dated Nov. 18, 2015.

\* cited by examiner

LEAD-FREE SOLDER ALLOY

TECHNICAL FIELD

The present invention relates to a lead-free solder alloy.

BACKGROUND ART

Electronic circuits (hereinafter referred to as "in-vehicle electronic circuits") obtained by soldering electronic parts to printed circuit boards are mounted on a vehicle. Such in-vehicle electronic circuits are used in units for electrically controlling components such as engine, power steering and brake, and are safety parts which are very important for the vehicle travel. Therefore, the in-vehicle electronic circuits must be operable in a stable state over a prolonged period of time without causing any failure. In particular, an in-vehicle electronic circuit for engine control is often disposed in the vicinity of the engine and is in a rather severe operating environment.

In fact, when the engine is rotated, the vicinity of the engine where such an in-vehicle electronic circuit is disposed has a high temperature of 100° C. or more. On the other hand, when the engine rotation is stopped, the outside air temperature in the vicinity of the engine in the winter season lowers to −30° C. or less in cold regions such as North America and Siberia. Therefore, the in-vehicle electronic circuit is exposed to heat cycles in a range from −30° C. or less to +100° C. or more by repeatedly operating and stopping the engine.

When an in-vehicle electronic circuit is disposed for a long period of time in an environment in which the temperature thus varies considerably, this causes thermal expansion and contraction of electronic parts and a printed circuit board. However, since there is a large difference between the coefficient of linear expansion of each electronic part and that of the printed circuit board, a certain degree of thermal displacement is repeatedly applied to each of portions where the electronic parts are joined to the printed circuit board by soldering (hereinafter referred to as "solder joints" as appropriate) during the use under the foregoing environment. The solder joints are then stressed and are finally broken.

Accordingly, a solder alloy joining the electronic parts to the printed circuit board is required to be expandable and contractible, in other words, to have ductility so as to prevent fracture of the solder joints. The solder alloy having excellent ductility reduces the stress caused by the thermal displacement as described above.

A vehicle not only runs on a flat road but may also run on a rugged road. Therefore, the vehicle is subject to vibration and impact from the road surface and in-vehicle electronic circuits mounted on the vehicle are also subject to such vibration and impact. Then, since solder joints of the in-vehicle electronic circuits need to have a sufficient strength to withstand such vibration and impact, the solder alloy itself also needs to have a higher tensile strength.

Since solder alloys for in-vehicle electronic circuits are thus required to have severe characteristics, few propositions have heretofore been made therefor.

From the viewpoint of heat cycle characteristics, Patent Literature 1 discloses an Sn—Ag—In—Bi solder alloy for use in a general electronic device to which Sb and Ni are added, the solder alloy comprising: 0.5 to 5% of Ag; 0.5 to 20% of In; 0.1 to 3% of Bi; in total up to 3% of at least one of Sb, Zn, Ni, Ga and Cu; and a balance of Sn. A solder alloy whose composition is closest to that in the invention to be described later and is specifically disclosed is an Sn-3.5Ag-12In-0.5Bi-0.2Sb-0.3Ni solder alloy described in Example 22 of Patent Literature 1.

CITATION LIST

Patent Literature

Patent Literature 1: JP 2004-188453 A

SUMMARY OF INVENTION

Technical Problems

However, Patent Literature 1 only shows the results of whether or not the solder alloy becomes deformed after heat cycling, and does not study at all as to whether or not it is possible to obtain mechanical characteristics (e.g., tensile strength and ductility) sufficient for the solder alloy to be durably used as an in-vehicle electronic circuit.

As for the specific composition, the solder alloy studied in the foregoing literature contains no less than 8 to 24% of In but contains only 0.5% of Bi. Therefore, the solder alloy is considered to be inferior in tensile strength in spite of a high In content. A high Bi content enlarges the solid-liquid coexisting region to make the solder alloy brittle due to precipitation of Bi, thus deteriorating the mechanical strength properties such as tensile strength and ductility. The Bi content of only 0.5% is considered to avoid these problems.

The composition described in Patent Literature 1 contains Sb and Ni in a total amount of no less than 0.5% in order to suppress allotropic transformation of Sn while also making the alloy structure uniform and compact to suppress γ transformation of Sn.

The solder alloy described in Patent Literature 1 thus needs to have a higher mechanical strength in an environment where vibration and impact are to be taken into account as in in-vehicle electronic circuits. In addition, the solder alloy for use in vehicles needs not only to suppress deformation in a heat cycle environment but also to suppress crack growth in solder joints in order to enhance the connection reliability.

In addition, it has also been desired to reduce the In content to the lowest possible level because In promotes phase transformation of Sn and is expensive.

An object of the present invention is to provide a solder alloy which has excellent tensile strength and ductility and which is capable of reducing costs while suppressing solder bump deformation and crack growth in solder joints after heat cycling.

To be more specific, the present invention aims at providing a lead-free solder alloy in which there is no deformation even after the passage of 800 cycles in a heat cycle test which involves keeping at temperatures of −40° C. and +125° C. for 10 minutes, respectively, as one reference assuming an actual use, in which occurrence and growth of cracks are suppressed even after the passage of 3,000 cycles in a heat cycle test which involves keeping at temperatures of −40° C. and +125° C. for 30 minutes, respectively, as one reference assuming an actual use, and which exhibits high tensile strength and ductility even at a reduced In content and can achieve a low cost.

Solution to Problems

The inventors of the present invention have made an intensive study on an alloy composition having a high tensile strength even at a reduced In content in the Sn-3.5Ag-12In-0.5Bi-0.2Sb-0.3Ni solder alloy specifically disclosed in Example 22 of Patent Literature 1. The inventors of the invention have focused attention on how much Bi which is considered to deteriorate the tensile strength and the ductility because of its brittleness is contained and precisely adjusted the In and Bi contents. Then, the inventors of the invention obtained the finding that, by increasing the Bi content to 1.5 to 5.5% while suppressing the In content in a range of 1.0 to 7.0%, the tensile strength and the ductility are enhanced to such an extent that the solder alloy is usable under severe conditions as in a vehicle, thus suppressing deformation of the solder alloy after heat cycling.

In addition, in the solder alloy in which the In and Bi contents were adjusted as described above, the inventors of the invention confirmed refinement of crystal grains at joint interfaces when the Ni content is in a range of 0.01 to 0.2% and the Sb content is in a range of 0.01 to 0.15% as compared to Patent Literature 1. The inventors of the invention also obtained the finding that the refinement of crystal grains suppresses occurrence and growth of cracks due to a heat cycle test and thus completed the invention.

The ductility as used in the specification refers to a value calculated from the ratio of the cross-sectional area of a fractured portion of a solder specimen to the cross-sectional area of the solder specimen before testing in a case where the solder specimen was broken in a tensile test.

The present invention is as follows:

(1) A lead-free solder alloy having an alloy composition comprising: 1.0 to 7.0 wt % of In, 1.5 to 5.5 wt % of Bi, 1.0 to 4.0 wt % of Ag, 0.01 to 0.2 wt % of Ni, 0.01 to 0.15 wt % of Sb, and a balance of Sn.

(2) The lead-free solder alloy according to (1) above, wherein In is incorporated in an amount of 1.0 to 6.5 wt % and Bi is incorporated in an amount of 2.5 to 4.0 wt %.

(3) A solder paste comprising the lead-free solder alloy according to (1) or (2) above.

(4) A preform material comprising the lead-free solder alloy according to (1) or (2) above.

(5) A solder joint comprising the lead-free solder alloy according to (1) or (2) above.

(6) An in-vehicle electronic circuit comprising the solder joint according to (5) above.

DESCRIPTION OF EMBODIMENTS

The present invention will be described below in further detail. Unless otherwise specified, "percentage (%)" regarding the solder alloy composition as used in the specification is "percentage by weight."

A lead-free solder alloy according to the invention has the alloy composition as described below.

In: 1.0 to 7.0%

The In content is 1.0 to 7.0%. In enters into solid solution in βSn to enhance the mechanical characteristics. Therefore, In enhances the tensile strength of the solder alloy. When the In content is less than 1.0%, the tensile strength of the solder alloy cannot be improved and crack growth cannot be suppressed after heat cycling. When the In content is more than 7.0% and is not greater than 10.0%, βSn is transformed into γSn to deform the solder alloy itself after the heat cycle test independently of the external stress, thereby causing short circuit between adjacent electrodes. An In content of more than 7.0% not only increases costs but also excessively lowers the solidus temperature to cause the solder alloy to melt through the heat cycle test. An In content of more than 10% deteriorates the tensile strength. The In content is preferably 1.0 to 6.5% and more preferably 1.0 to 6.0%.

Bi: 1.5 to 5.5%

The Bi content is 1.5 to 5.5%. Bi enters into solid solution in βSn to enhance the mechanical characteristics. Therefore, Bi enhances the tensile strength of the solder alloy. Bi also improves the heat cycle characteristics and lowers the liquidus temperature. When the Bi content is less than 1.5%, addition of Bi does not produce any effect. When the Bi content is more than 5.5%, Bi enters into solid solution in a supersaturated state to make the solder alloy brittle. The Bi content is more preferably 2.5 to 4.0%.

According to the solder alloy of the invention, the Bi and In ranges are thus optimized so as to obtain excellent joint reliability in terms of tensile strength, ductility and the like. The reason why the joint reliability is obtained in terms of tensile strength, ductility and the like is presumed as follows: According to an Sn—Bi binary phase diagram, when the Bi content is more than 0.6% but less than 5.5%, Bi is in a supersaturated solid solution state with respect to Sn at room temperature. It is generally known that a Bi-rich phase appears when free energy for allowing the Bi-rich phase (enriched phase) to appear exceeds activation energy in the above state. When the Bi-rich phase appears, the solder joint portions get brittle. The activation energy depends on energy stored by crystal grain boundaries and lattice defects such as point defects in a solder structure. In other words, the smaller the energy stored by lattice defects is, the higher the activation energy is.

The solder alloy according to the invention contains In. In has the effect of suppressing Sn lattice defects while increasing the activation energy necessary for allowing the Bi-rich phase to appear. For this reason, the Bi-rich phase (enriched phase) is considered to be prevented from appearing, thus stabilizing the solid solution state of Bi. The alloy composition was precisely investigated from this point of view and as a result it was revealed that, in a case where the Bi content is 1.5 to 5.5%, an In content ranging from 1.0 to 7.0% suppresses appearance of the Bi-rich phase (enriched phase), reduces supersaturated solid solution of Bi and achieves high tensile strength and excellent ductility. In other words, the solder alloy according to the invention can exhibit a high tensile strength and maintain excellent ductility because the Bi content is in a proper range although the In content is decreased compared to the alloy composition disclosed in Patent Literature 1.

Ag: 1.0 to 4.0%

The Ag content is 1.0 to 4.0%. Ag precipitates intermetallic compounds such as Ag3Sn and hence enhances the tensile strength of the solder alloy. Ag also contributes to improving the heat cycle characteristics and improves the wettability on soldered portions at the time of soldering. When the Ag content is less than 1.0%, addition of Ag cannot produce any effect. Addition of Ag in an amount of more than 4.0% does not considerably improve the tensile strength. The liquidus temperature is also increased to reduce the solderability. In addition, it is not economically preferable to add expensive Ag in a large amount. The Ag content is preferably 1.0 to 3.0% and more preferably 2.0 to 3.0%.

Ni: 0.01 to 0.2%, Sb: 0.01 to 0.15%

The Ni content is 0.01 to 0.2% and the Sb content is 0.01 to 0.15%. Ni and Sb promote refinement of intermetallic compound crystal grains formed at a solder joint interface to suppress occurrence and growth of cracks resulting from a heat cycle test and to maintain the joint strength and the ductility of the solder joint. The foregoing effects cannot be obtained when these contents are each less than 0.01. The ductility deteriorates when the Ni content is more than 0.2% or/and the Sb content is more than 0.15%. The Ni content is preferably 0.02 to 0.08% and more preferably 0.03 to 0.07%. The Sb content is preferably 0.03 to 0.09% and more preferably 0.05 to 0.08%.

Addition of trace amounts of Sb and Ni to the solder alloy according to the invention promotes refinement of intermetallic compound crystal grains formed at the joint interface of the solder joint after reflow soldering. More specifically, the crystal grains have an average particle size of about 1 to 3 µm. Such a particle size allows occurrence of cracks to be suppressed after a heat cycle test. The average particle size in the invention is a value determined by image analysis software Scandium (Seika Corporation).

The solder alloy according to the invention can be suitably used in the form of a preform material, solder balls or solder paste. Such a preform material is in the shape of a washer, a ring, a pellet, a disk, a ribbon, a wire, or the like.

The solder alloy according to the invention can be used in the form of solder paste. The solder paste is in a paste form and is obtained by mixing solder alloy powder with a small amount of flux. The solder alloy according to the invention may be used in the form of solder paste when mounting electronic parts on a printed circuit board by a reflow soldering method. The flux for use in the solder paste may be a water-soluble flux or a water-insoluble flux. Typically, a rosin flux which is a rosin-based water-insoluble flux is used.

The solder joint according to the invention uses the solder alloy according to the invention to join and connect terminals in a package (PKG) of an IC chip or the like to terminals of a board such as a printed circuit board (PCB). In short, the solder joint according to the invention refers to a portion where the terminals as described above are joined to the solder. The solder joint according to the invention can be thus formed using common soldering conditions.

The in-vehicle electronic circuit according to the invention is an electronic circuit that may be incorporated in a central computer of a so-called automotive electronic control unit for electrical control such as engine output control and brake control, and specific examples of the electronic circuit that may be illustrated include a power module and a hybrid semiconductor electronic circuit.

The solder alloy according to the invention can reduce a dose by using a low α material. The solder paste, the preform material and the solder joint according to the invention can reduce a dose in the same manner as the solder alloy according to the invention by using a low α material. The in-vehicle electronic circuit according to the invention uses a low α solder joint and can hence suppress memory errors.

EXAMPLES

Each solder alloy having an alloy composition described in Table 1 was prepared and evaluated for its characteristics according to the procedure to be described later.

In Examples, solder bumps using each solder alloy were subjected to a heat cycle test and deformation of the solder bumps after the heat cycle test was examined. A solder joint of a chip resistor joined using solder paste was subjected to a heat cycle test to examine the crack growth rate of the solder joint of the chip resistor. Each solder alloy was subjected to a tensile test to examine the tensile strength and the ductility. Each examination content is as follows:

*Deformation of Solder Bumps

Each solder alloy was formed into solder pellets with a size of 2.5×2.5×0.5 mm. The solder pellets were mounted on a Cu pad and were then subjected to reflow soldering at 245° C. to prepare solder bumps. These solder bumps were charged into a heat cycle tank which was set to conditions of keeping at −40° C. and +125° C. for 10 minutes, respectively, and exposed to a heat cycle environment where the foregoing conditions were repeated for 200 cycles or 800 cycles. Then, whether or not there was deformation of the solder bumps was visually observed in cross-sectional scanning electron micrographs.

*Crack Growth Rate

A chip resistor was mounted on each of 20 electrodes in a glass epoxy substrate (MCL-E-67, FR-4 manufactured by Hitachi Chemical Co., Ltd.) with a size of 110 mm×110 mm×1.6 mm (thickness) using each of the solder alloys. This substrate was subjected to reflow soldering at 245° C. to join the chip resistor to the substrate thereby forming a solder joint. This substrate was charged into a heat cycle tank which was set to conditions of keeping at −40° C. and +125° C. for 30 minutes, respectively. A heat cycle test was carried out in which the foregoing conditions corresponding to one cycle were repeated for 1,000 cycles, 2,000 cycles and 3,000 cycles.

Figure 1:
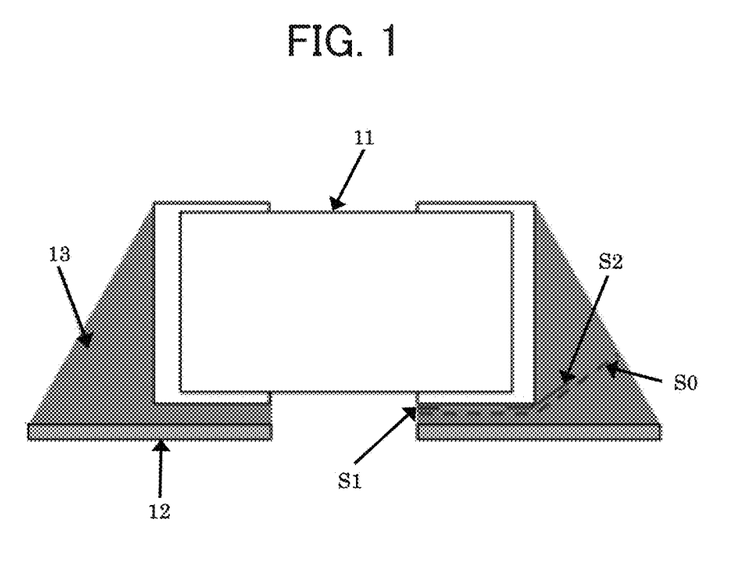
FIG. 1 is a cross-sectional schematic view for illustrating the crack growth rate.

After the heat cycle test, the state of cracks that occurred in the solder joint was observed by a metallurgical microscope at a magnification of 140×. FIG. 1 is a cross-sectional schematic view for illustrating the crack growth rate. The cross-sectional schematic view shown in FIG. 1 is a schematic view of a cross-section obtained by cutting a chip resistor mounted on a substrate along the center plane in its width direction so as to include electrodes. In Examples, this cross-section was observed to evaluate the crack growth rate. As shown in FIG. 1, a chip resistor 11 is connected to an electrode land 12 with solder 13. In addition, as shown in FIG. 1, the crack growth rate was calculated according to expression 1 shown below by the ratio between the sum (S1+S2) of lengths (S1 and S2 indicated by solid lines in the drawing) of actually occurring cracks and the total length (S0 indicated by a broken line in the drawing) of a presumed crack line estimated from the actually occurring cracks.

Crack growth rate={(sum of crack lengths $(S1+S2)$)/ (total length of presumed crack line $(S0)$)}×100    Expression 1

A sample in which the crack growth rate did not exceed 50% in all of the 20 electrodes was rated as good and a sample in which the crack growth rate exceeded 50% in at least one of the 20 electrodes was rated as poor. In Examples, the higher of the crack growth rate values in the left and right electrodes shown in FIG. 1 was taken as the crack growth rate of the part. Moreover, in a case where a crack reached a void occurring at the joint interface between the chip resistor 11 and the solder 13, the void was deemed to be a crack.

*Tensile Test

The tensile strength was measured according to JIS Z 3198-2. Each solder alloy described in Table 1 was cast into a mold to prepare a specimen with a gauge length of 30 mm and a diameter of 8 mm. The thus prepared specimen was pulled by Type 5966 (Instron) at room temperature at a stroke of 6 mm/min to measure the strength upon fracture of the specimen. The ductility (reduction of area) was measured from the ratio of the cross-sectional area $S_1$ of a fractured portion of the specimen to the cross-sectional area $S_0$ before testing. According to the invention, a case where the tensile strength was 73 MPa or more and the ductility was 18% or more was deemed to be at a level at which there was no problem in practical use.

In Table 1, compositions which fall outside the scope of the invention and inferior evaluation results are underlined. In Comparative Examples, in cases where the deformation, tensile strength or ductility was inferior, the crack growth rate was not examined.

TABLE 1

| | Alloy composition [%] | | | | | | Deformation | Tensile strength [MPa] | Ductility [%] | Crack growth rate | Refinement |
|---|---|---|---|---|---|---|---|---|---|---|---|
| | Sn | In | Bi | Ag | Ni | Sb | | | | | |
| Example 1 | bal. | 3.0 | 3.0 | 3.0 | 0.06 | 0.07 | No | 78.67 | 23.61 | Good | Yes |
| Example 2 | bal. | 5.0 | 3.0 | 3.0 | 0.05 | 0.07 | No | 81.82 | 22.59 | Good | Yes |
| Example 3 | bal. | 6.0 | 3.0 | 3.0 | 0.05 | 0.07 | No | 87.98 | 19.72 | Good | Yes |
| Example 4 | bal. | 3.0 | 2.5 | 3.0 | 0.05 | 0.07 | No | 73.01 | 33.95 | Good | Yes |
| Example 5 | bal. | 3.0 | 4.0 | 3.0 | 0.05 | 0.07 | No | 87.17 | 18.06 | Good | Yes |
| Example 6 | bal. | 3.0 | 3.0 | 3.0 | 0.01 | 0.02 | No | 78.86 | 28.90 | Good | Yes |
| Example 7 | bal. | 3.0 | 3.0 | 3.0 | 0.03 | 0.06 | No | 79.51 | 23.90 | Good | Yes |
| Example 8 | bal. | 3.0 | 3.0 | 3.0 | 0.07 | 0.10 | No | 81.14 | 22.26 | Good | Yes |
| Example 9 | bal. | 3.0 | 3.0 | 3.0 | 0.09 | 0.10 | No | 75.63 | 21.23 | Good | Yes |
| Example 10 | bal. | 3.0 | 3.0 | 3.0 | 0.20 | 0.15 | No | 75.69 | 18.02 | Good | Yes |
| Comparative Example 1 | bal. | 0.1 | 3.0 | 3.0 | 0.05 | 0.07 | No | 72.42 | 36.68 | — | — |
| Comparative Example 2 | bal. | 0.5 | 3.0 | 3.0 | 0.05 | 0.07 | No | 75.06 | 34.84 | Poor | No |
| Comparative Example 3 | bal. | 9.0 | 3.0 | 3.0 | 0.05 | 0.07 | Yes | 88.05 | 29.72 | — | — |
| Comparative Example 4 | bal. | 3.0 | 0.5 | 3.0 | 0.05 | 0.07 | No | 52.58 | 54.39 | — | — |
| Comparative Example 5 | bal. | 3.0 | 1.0 | 3.0 | 0.05 | 0.07 | No | 57.93 | 46.53 | — | — |
| Comparative Example 6 | bal. | 3.0 | 6.0 | 3.0 | 0.05 | 0.07 | No | 93.39 | 11.08 | — | — |
| Comparative Example 7 | bal. | 3.0 | 3.0 | 3.0 | — | — | No | 77.20 | 33.25 | Poor | No |
| Comparative Example 8 | bal. | 3.0 | 3.0 | 3.0 | 0.29 | 0.22 | No | 81.14 | 14.35 | — | Yes |
| Comparative Example 9 | bal. | 12.0 | 0.5 | 3.5 | 0.30 | 0.20 | No | 52.58 | 54.39 | — | — |

According to Table 1, Examples 1 to 10 each showing an alloy composition within the scope of the invention did not cause deformation after heat cycle testing and showed a tensile strength of 73 MPa or more and a reduction of area of 18% or more. Moreover, refinement of intermetallic compounds at the joint interfaces owing to the addition of Ni and Sb was confirmed, and crack growth was suppressed.

Figure 2A:
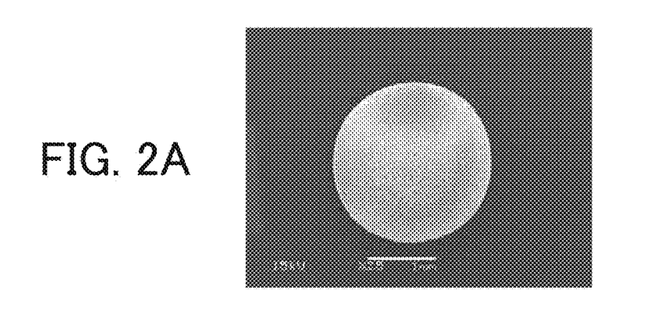
FIG. 2A is a cross-sectional scanning electron micrograph of a solder bump having a composition of Sn-3Ag-3Bi-3In-0.07Sb-0.05Ni according to the invention before heat cycling.
Figure 2B:
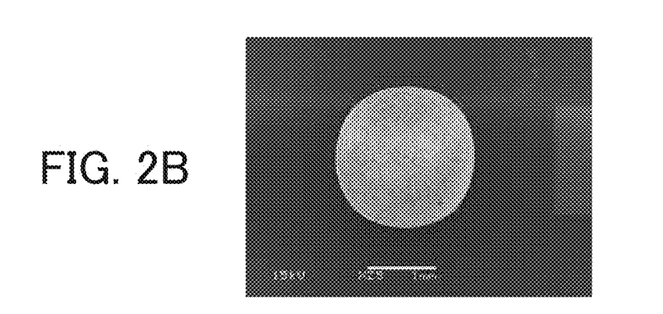
FIG. 2B is a cross-sectional scanning electron micrograph of the solder bump after 200 heat cycles.
Figure 2C:
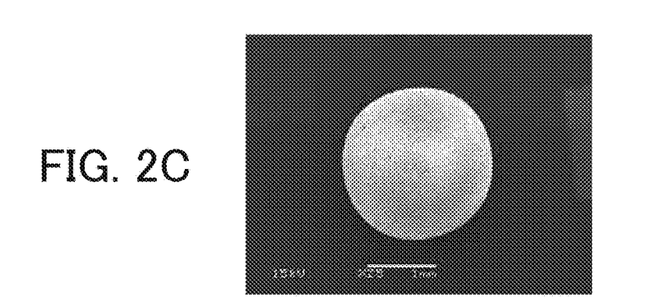
FIG. 2C is a cross-sectional scanning electron micrograph of the solder bump after 800 heat cycles.
Figure 3A:
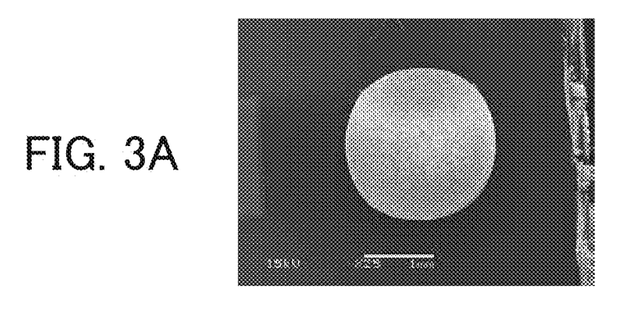
FIG. 3A is a cross-sectional scanning electron micrograph of a solder bump having a composition of Sn-3Ag-3Bi-6In-0.07Sb-0.05Ni according to the invention before heat cycling.
Figure 3B:
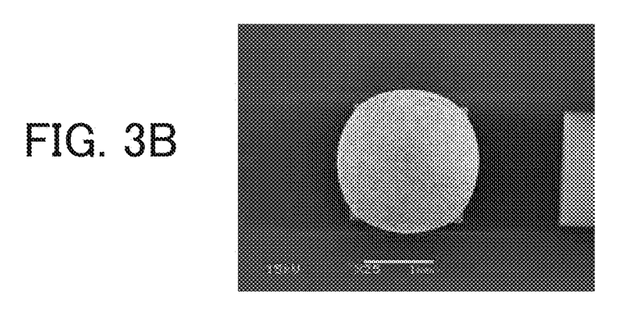
FIG. 3B is a cross-sectional scanning electron micrograph of the solder bump after 200 heat cycles.
Figure 3C:
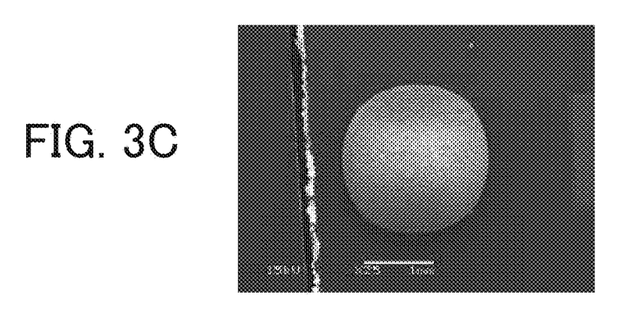
FIG. 3C is a cross-sectional scanning electron micrograph of the solder bump after 800 heat cycles.
Figure 4A:
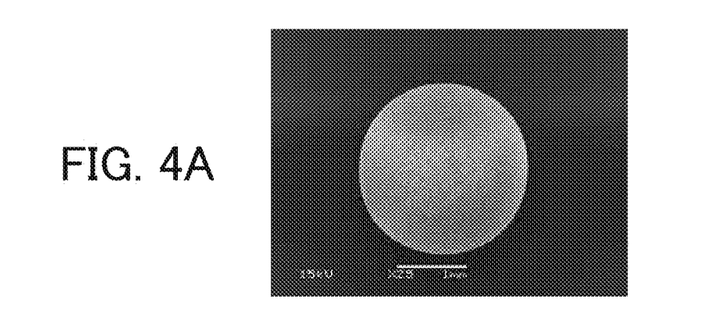
FIG. 4A is a cross-sectional scanning electron micrograph of a solder bump having a composition of Sn-3Ag-3Bi-9In-0.07Sb-0.05Ni in a comparative example before heat cycling.
Figure 4B:
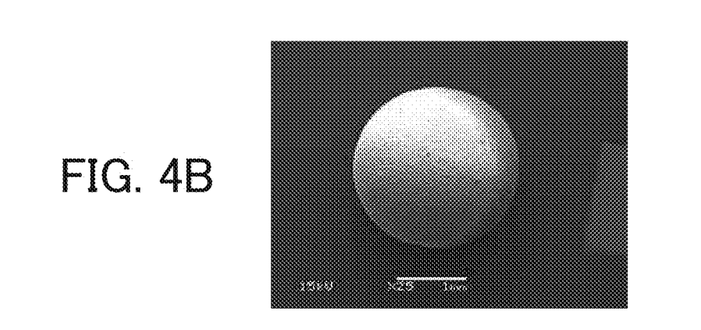
FIG. 4B is a cross-sectional scanning electron micrograph of the solder bump after 200 heat cycles.
Figure 4C:
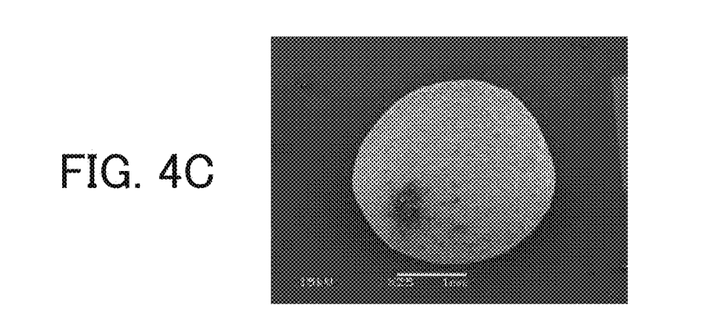
FIG. 4C is a cross-sectional scanning electron micrograph of the solder bump after 800 heat cycles.

FIGS. 2 to 4 are scanning electron micrographs for observing the relation between the In content and the solder bump deformation. The micrographs are taken at a magnification of 25×.

FIG. 2(a) is a cross-sectional scanning electron micrograph of a solder bump having a composition of Sn-3Ag-3Bi-3In-0.07Sb-0.05Ni according to the invention before heat cycling; FIG. 2(b) is a cross-sectional scanning electron micrograph of the solder bump after 200 heat cycles; and FIG. 2(c) is a cross-sectional scanning electron micrograph of the solder bump after 800 heat cycles. FIG. 3(a) is a cross-sectional scanning electron micrograph of a solder bump having a composition of Sn-3Ag-3Bi-6In-0.07Sb-0.05Ni according to the invention before heat cycling; FIG. 3(b) is a cross-sectional scanning electron micrograph of the solder bump after 200 heat cycles; and FIG. 3(c) is a cross-sectional scanning electron micrograph of the solder bump after 800 heat cycles. FIG. 4(a) is a cross-sectional scanning electron micrograph of a solder bump having a composition of Sn-3Ag-3Bi-9In-0.07Sb-0.05Ni in a comparative example before heat cycling; FIG. 4(b) is a cross-sectional scanning electron micrograph of the solder bump after 200 heat cycles; and FIG. 4(c) is a cross-sectional scanning electron micrograph of the solder bump after 800 heat cycles.

As shown in FIG. 2(c) and FIG. 3(c), the solder bump using the solder alloy in Example 1 in which the In content was 3% and the solder bump using the solder alloy in Example 3 in which the In content was 6% did not have solder bump deformation even after 800 heat cycles. In addition, it was confirmed that all of Examples and Comparative Examples except Comparative Example 3 did not have solder bump deformation. On the other hand, the solder bump using the solder alloy in Comparative Example 3 in which the In content was 9% began to get distorted after 200 cycles as shown in FIG. 4(b) and became clearly deformed after 800 cycles as shown in FIG. 4(c). When the In content was 9%, γ transformation of the Sn phase was confirmed by DSC (Differential Scanning calorimetry).

The solder alloy in Comparative Example 1 was low in In content and was hence inferior in tensile strength.

The solder alloy in Comparative Example 2 showed a tensile strength of 75 MPa because the In content was higher than in Comparative Example 1. However, the solder alloy in Comparative Example 2 has an In content of less than 1.0%. Therefore, in the solder joint using the solder alloy in Comparative Example 2, there was no refinement of intermetallic compounds at the joint interface and the crack growth rate was poor.

The solder alloys in Comparative Examples 4 and 5 were low in Bi content and were hence inferior in tensile strength. The solder alloy in Comparative Example 6 was high in Bi content and was hence inferior in ductility due to precipitation of Bi.

Figure 5A:
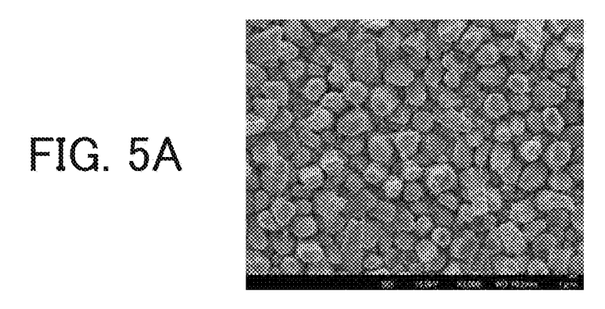
FIG. 5A is a joint surface scanning electron micrograph of a solder bump after reflow soldering which has a composition of Sn-3Ag-3Bi-3In in a comparative example.
Figure 5B:
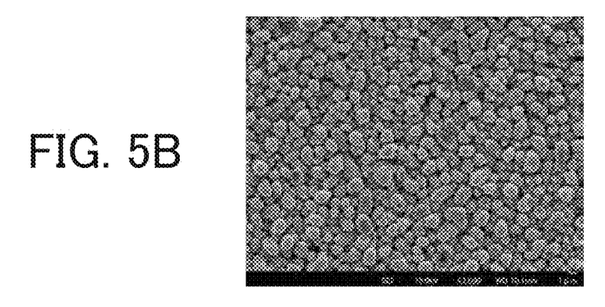
FIG. 5B is a joint surface scanning electron micrograph of a solder bump after reflow soldering which has a composition of Sn-3Ag-3Bi-3In-0.02Sb-0.01Ni according to the invention.
Figure 5C:
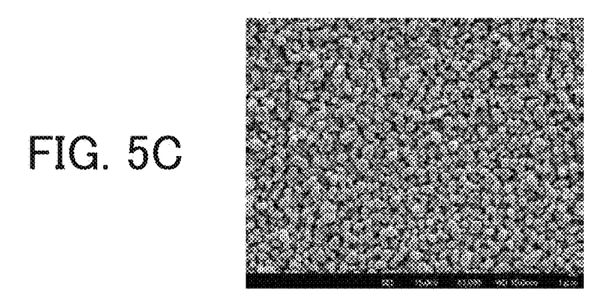
FIG. 5C is a joint surface scanning electron micrograph of a solder bump after reflow soldering which has a composition of Sn-3Ag-3Bi-3In-0.06Sb-0.03Ni according to the invention.
Figure 6A:
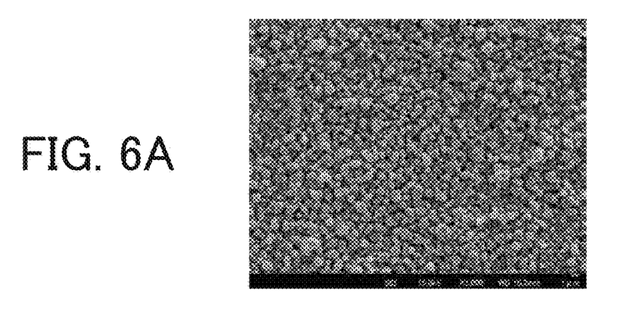
FIG. 6A is a joint surface scanning electron micrograph of a solder bump after reflow soldering which has a composition of Sn-3Ag-3Bi-3In-0.07Sb-0.05Ni according to the invention.
Figure 6B:
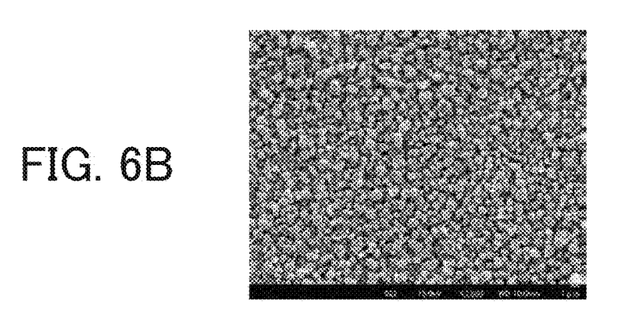
FIG. 6B is a joint surface scanning electron micrograph of a solder bump after reflow soldering which has a composition of Sn-3Ag-3Bi-3In-0.10Sb-0.07Ni according to the invention.
Figure 6C:
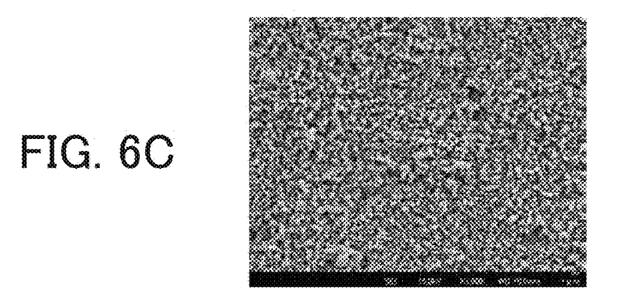
FIG. 6C is a joint surface scanning electron micrograph of a solder bump after reflow soldering which has a composition of Sn-3.0Ag-3.0Bi-3In-0.22Sb-0.29Ni in Comparative Example 8.

FIGS. 5 to 6 are scanning electron micrographs for observing the relation between the Sb and Ni contents and the solder alloy structure. The micrographs are taken at a magnification of 3,000×. These micrographs are surface micrographs after reflow soldering at a maximum temperature of 245° C.

FIG. 5(a) is a joint surface scanning electron micrograph of a solder bump after reflow soldering which has a composition of Sn-3Ag-3Bi-3In in a comparative example; FIG. 5(b) is a joint surface scanning electron micrograph of a solder bump after reflow soldering which has a composition of Sn-3Ag-3Bi-3In-0.02Sb-0.01Ni according to the invention; and FIG. 5(c) is a joint surface scanning electron micrograph of a solder bump after reflow soldering which has a composition of Sn-3Ag-3Bi-3In-0.06Sb-0.03Ni according to the invention. FIG. 6(a) is a joint surface scanning electron micrograph of a solder bump after reflow soldering which has a composition of Sn-3Ag-3Bi-3In-0.07Sb-0.05Ni according to the invention; FIG. 6(b) is a joint surface scanning electron micrograph of a solder bump after reflow soldering which has a composition of Sn-3Ag-3Bi-3In-0.10Sb-0.07Ni according to the invention; and FIG. 6(c) is a joint surface scanning electron micrograph of a solder bump after reflow soldering which has a composition of Sn-3.0Ag-3.0Bi-3In-0.22Sb-0.29Ni in Comparative Example 8.

As shown in FIGS. 5(b), 5(c), 6(a) and 6(b), structure refinement was confirmed in Examples 1 to 10 in which the Ni content was in a range of 0.01 to 0.2% and the Sb content was in a range of 0.01 to 0.15%. However, as shown in FIG. 5(a), structure refinement was not confirmed in Comparative Example 7 in which the solder alloy contained neither Ni nor Sb. In addition, as shown in FIG. 6(c), structure refinement was also confirmed in Comparative Example 8 in which the Sb and Ni contents were 0.22% and 0.29%, respectively, as in Examples 1 to 10.

However, the ductility of 14.35% in Comparative Example 8 was an insufficient value.

Comparative Example 9 specifically disclosed in Patent Literature 1 was inferior in tensile strength because of a low Bi content although the In content was 12%.

Figure 7:
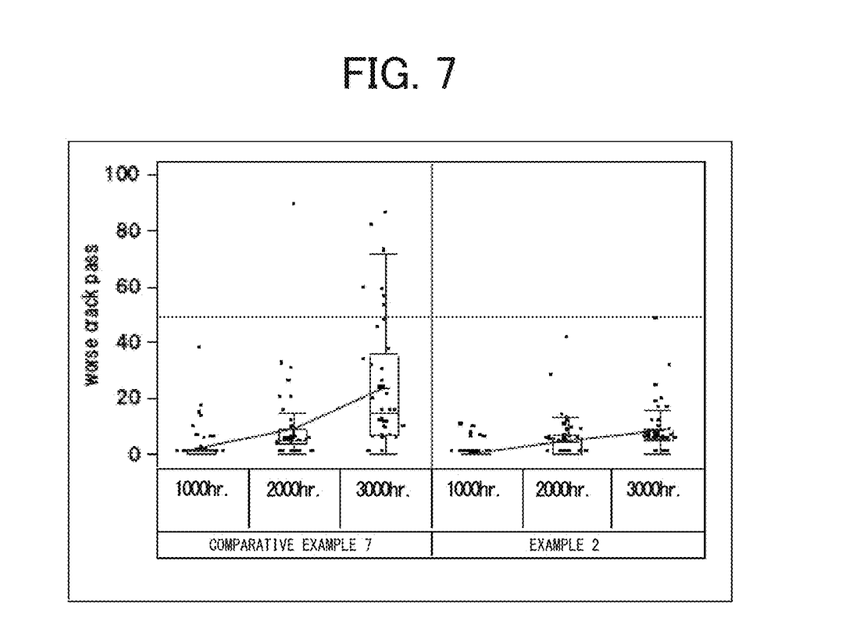
FIG. 7 is a diagram showing the distribution of the crack growth rate in solder joints of chip resistors joined using solder paste having a composition of Sn-3Ag-3Bi-3In in a comparative example and solder paste having a composition of Sn-3AG-3Bi-3In-0.07Sb-0.05Ni according to the invention.

FIG. 7 is a diagram showing the distribution of the crack growth rate in solder joints of chip resistors joined using solder paste having a composition of Sn-3Ag-3Bi-3In in Comparative Example 7 and solder paste having a composition of Sn-3Ag-3Bi-3In-0.07Sb-0.05Ni in Example 2 according to the invention. As shown in FIG. 7, the crack growth rate exceeded 50% in a lot of samples in Comparative Example 7 after the passage of 3,000 hours. On the other hand, the crack growth rate did not exceed 50% after the passage of 3,000 hours in Example 2 in which crystal grain refinement at the joint interface was confirmed, as compared to Comparative Example 7.

From the above, the lead-free solder alloy according to the invention suppresses solder bump deformation and solder joint cracking after heat cycle testing and is hence particularly useful as a solder alloy for in-vehicle electronic circuits. In other words, the lead-free solder alloy according to the invention can be used without any problem in electronic circuits in cold regions and tropical regions. The lead-free solder alloy according to the invention has both of high tensile strength and high ductility and is hence extremely promising as a solder alloy capable of also withstanding impact applied while a vehicle is running.

The invention claimed is:

1. A lead-free solder alloy having an alloy composition consisting of:
   1.0 to 6.5 wt % of In, more than 3.0 wt % but not more than 4.0 wt % of Bi, 1.0 to 3.0 wt % of Ag, 0.02 to 0.06 wt % of Ni, 0.06 to 0.09 wt % of Sb, and a balance of Sn.

2. A solder paste comprising the lead-free solder alloy according to claim 1.

3. A preform material comprising the lead-free solder alloy according to claim 1.

4. A solder joint comprising the lead-free solder alloy according to claim 1.

5. A lead-free solder alloy having an alloy composition consisting of:
   1.0 to 6.0 wt % of In, more than 3.0 wt % but not more than 4.0 wt % of Bi, 2.0 to 3.0 wt % of Ag, 0.03 to 0.06 wt % of Ni, 0.06 to 0.08 wt % of Sb, and a balance of Sn.

6. A solder paste comprising the lead-free solder alloy according to claim 5.

7. A preform material comprising the lead-free solder alloy according to claim 5.

8. A solder joint comprising the lead-free solder alloy according to claim 5.

9. A lead-free solder alloy having an alloy composition consisting of:
   1.0 to 7.0 wt % of In, more than 3.0 to 5.5 wt % of Bi, 1.0 to 4.0 wt % of Ag, 0.01 to 0.06 wt % of Ni, 0.06 to 0.09 wt % of Sb, and a balance of Sn.

10. A solder paste comprising the lead-free solder alloy according to claim 9.

11. A preform material comprising the lead-free solder alloy according to claim 9.

12. A solder joint comprising the lead-free solder alloy according to claim 9.

* * * * *